United States Patent
Yang et al.

(10) Patent No.: US 6,759,295 B1
(45) Date of Patent: Jul. 6, 2004

(54) METHOD OF DETERMINING THE ACTIVE REGION WIDTH BETWEEN SHALLOW TRENCH ISOLATION STRUCTURES USING A GATE CURRENT MEASUREMENT TECHNIQUE FOR FABRICATING A FLASH MEMORY SEMICONDUCTOR DEVICE AND DEVICE THEREBY FORMED

(75) Inventors: Tien-Chun Yang, San Jose, CA (US); Nian Yang, San Jose, CA (US); Zhigang Wang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 56 days.

(21) Appl. No.: 10/224,737

(22) Filed: Aug. 20, 2002

(51) Int. Cl.$^7$ ............................................. H01I 21/336
(52) U.S. Cl. ......................... 438/257; 438/14; 438/424
(58) Field of Search ........................... 438/257, 14, 424

(56) References Cited

U.S. PATENT DOCUMENTS 5,624,866 A * 4/1997 Kim ........................... 438/426
6,184,091 B1 * 2/2001 Gruening et al. ........... 438/270

* cited by examiner

Primary Examiner—Thanh Nguyen
(74) Attorney, Agent, or Firm—Farjami & Farjami LLP

(57) ABSTRACT

A method of determining the active region width (10) of an active region (4) by measuring the respective gate currents ($I_{g,100}$, $I_{g,100'}$, $I_{g,100''}$) of respective composite capacitance structures (100, 100', 100"), respectively comprising at least one capacitor element (16, 17, 18; 16', 17', 18"; 16", 17", 18") having respective predetermined widths ($W_i$) for fabricating a flash memory semiconductor device, and a device thereby fabricated. The present method also comprises plotting the respective gate currents ($I_{g,100}$, $I_{g,100'}$, $I_{g,100''}$) as a quasi-linear function (IW) of the respective predetermined widths ($W_i$), extrapolating a calibration term ($W_{I=0}$) from the quasi-linear function (IW), and subtracting the calibration term ($W_{Ig=0}$) from the respective predetermined widths ($W_i$) to define and constrain the active region width (10) for facilitating device fabrication.

20 Claims, 1 Drawing Sheet

US 6,759,295 B1

Figure 1:
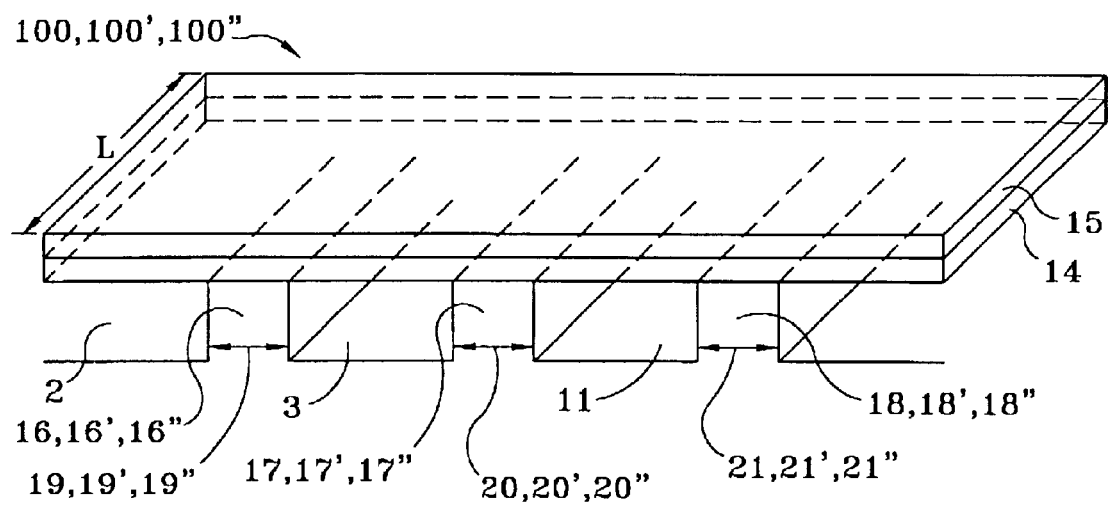

METHOD OF DETERMINING THE ACTIVE REGION WIDTH BETWEEN SHALLOW TRENCH ISOLATION STRUCTURES USING A GATE CURRENT MEASUREMENT TECHNIQUE FOR FABRICATING A FLASH MEMORY SEMICONDUCTOR DEVICE AND DEVICE THEREBY FORMED

CROSS-REFERENCE TO RELATED APPLICATION(S)

This application is also related to the following and commonly assigned applications (serial numbers to be assigned) entitled:

(1) "Method of Determining the Active Region Width between Shallow Trench Isolation Structures Using a Tunneling Current Measurement Technique for Fabricating a Flash Memory Semiconductor Device and a Device thereby Fabricated," Attorney Docket No. ID0781;

(2) "Method of Determining the Active Region Width between Shallow Trench Isolation Structures Using a C-V Measurement Technique for Fabricating a Flash Memory Semiconductor Device and a Device thereby Fabricated," Attorney Docket No. ID0783; and (3) "Method of Determining the Active Region Width between Shallow Trench Isolation Structures Using an Overdrive Current Measurement Technique for Fabricating a Flash Memory Semiconductor Device by and a Device thereby Fabricated," Attorney Docket No. ID0784.

TECHNICAL FIELD

The present invention relates to the fabrication of semiconductor devices. In particular, the present invention relates to the fabrication of flash memory semiconductor devices. With still greater particularity, the present invention relates to testing procedures, used during semiconductor device fabrication, for determining the width of the active region disposed between shallow trench isolation structures which isolate circuit elements in flash memory arrays.

BACKGROUND ART

Flash memory devices are used in wide array of electronic devices, such as computers, digital cameras, and personal digital assistants. In all such applications, increasing memory capacity and reducing electrical consumption are desirable. The primary related art method for increasing capacity and decreasing power requirements has been to make each succeeding generation of devices smaller. The current technology involves geometries of less than 0.25-$\mu$m. As the circuit elements become smaller, problems arise relating to interference between different elements.

The former generation of flash memory used local oxidation of silicon (LOCOS) technology to isolate circuit elements. LOCOS has been replaced in the current generation by shallow trench isolation (STI) technology to isolate circuit elements. In STI technology, STI structures are typically formed between circuit elements which are commonly referred to as metal oxide semiconductor field effect transistors (MOSFETs). MOSFETs include a source region and a drain region of doped semiconductor material, between which current traverses. This current is controlled by a gate which is insulated from the source and drain regions by a thin layer of insulating material, such as a tunnel oxide. As is conventional, multiple gate layers are insulated from each other by insulating layers. A "floating" gate is produced which controls the signal and functions according to the principle of quantum tunneling. In STI technology, the source, drain, and floating gate are formed between the shallow trench isolation structures formed by etching into the substrate of semiconductor materials, such as silicon, germanium, or gallium arsenide, thereby forming trenches, and, thereafter, by filling the trenches with an insulating material. A thin layer of an insulating material, such as silicon oxide or silicon dioxide (e.g., SiO, $SiO_2$, respectively), is formed over the active region between trenches, the insulating material to later form a tunnel oxide layer. The floating gate is formed from a semiconducting material (e.g., a polycrystalline silicon) on this insulating material. In operation, a small charge on this floating gate can control the current flow between the source region and the drain region. The active region width, sometimes also referred to as "real overlap" width, is the distance between two shallow trench isolation structures.

A problem has arisen in STI technology where opposing end portions of a tunnel oxide layer, which are respectively disposed adjacent the opposing upper corners of the shallow trench isolation structures, are being thinned. This thinning of the opposing end portions is difficult to measure and to quantify. While the presence of thinning opposing end portions may be made by monitoring the Fowler-Nordheim (F-N) tunneling current, such a measurement, in and of itself, is merely qualitative and provides no measure of, nor any other information regarding, the active region comprising a floating gate and source/drain regions.

This active region width, affected by the thinning opposing end portions, has a large and notable impact on the programming current distribution and the core gain. Thus, a need exists for a method of accurately determining the width of the active region between shallow trench isolation structures for fabricating a flash memory semiconductor device and a device thereby formed.

DISCLOSURE OF THE INVENTION

Accordingly, the present invention provides a solution to the foregoing related art problems in a method for accurately determining the width of the active region between shallow trench isolation structures by using a noninvasive nondestructive testing procedure for fabricating a flash memory semiconductor device, and a device thereby fabricated. The present device comprises at least one composite capacitor structure having a plurality of capacitor elements (e.g., a MOS capacitor element). The present method measures the respective gate current of each at least one composite capacitor structure from the gate through the tunnel oxide layer to the active region, where each at least one composite capacitor structure has an identical active region length (i.e., equal source/drain lengths) but also has a distinct active region width and a distinct predetermined width. The respective gate current value of each at least one composite capacitor structure facilitates determining the active region widths for various MOS capacitor elements by using the noninvasive nondestructive testing techniques. Since the respective measured gate current values correspond to the various active regions where tunnel oxide thinning occurs, the corresponding active region widths can be determined.

The present method involves measuring the gate current (e.g., a Fowler-Nordheim tunneling current) flowing from a floating gate through a tunnel oxide layer to an active region. Since the Fowler-Nordheim tunneling current is proportional to the total area of the composite capacitor structure, where the oxide electric filed is the same, the total current is proportional to the active region width at the STI structure has been formed. The active region width is then mathematically derived from the gate current values and the predetermined width as the tunneling current value is proportional to the active region width.

The present method provides crucial information for fabricating a flash memory semiconductor device, because the channel width, corresponding to the active region width, affects the following parameters: the programming current, the programmed voltage threshold, the threshold voltage distribution, as well as the core gain. These parameters, in combination, substantially influence the construction of a flash memory semiconductor devices and their associated technology.

BRIEF DESCRIPTION OF THE DRAWING(S)

For a better understanding of the present invention, reference is made to the below-referenced accompanying drawing(s) which is/are for illustrative purposes and where like reference numbers denote like elements.

(1) FIG. 1 is a perspective view of a composite capacitor structure comprising a plurality of capacitor elements, the composite capacitor structure having a respective active region having a respective predetermined width, each capacitor element being separated by successive STI structures for use in gate current measurement technique in determining the active region width for fabricating a flash memory semiconductor device application, in accordance with the present invention.

Figure 2:
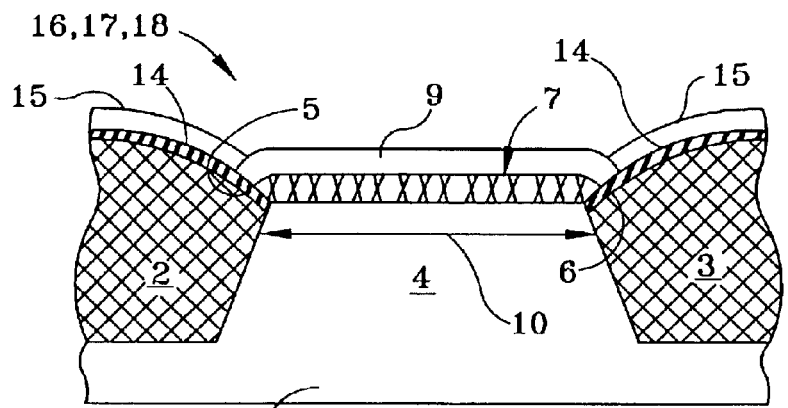

(2) FIG. 2 is a front elevation sectional view of the representative capacitor element of FIG. 1, showing a representation of the active region width of an active region between successive STI structures where thinning opposing portions of a tunnel oxide layer may occur, in accordance with the present invention.

Figure 3:
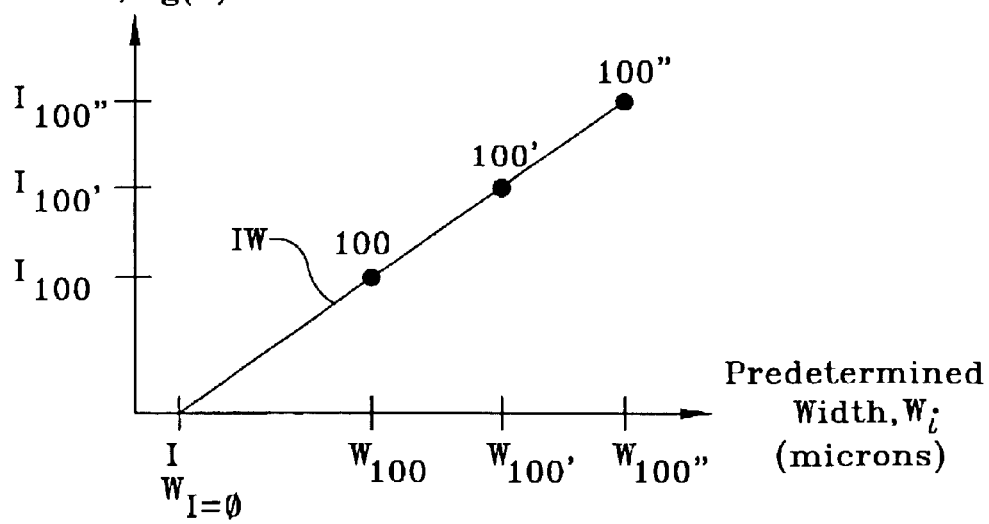

(3) FIG. 3 is a graphical representation of the respective gate current values for each at least one composite capacitor structure as a function of the respective predetermined widths of FIG. 1 for determining a calibration term in constraining the active region width for fabricating a flash memory semiconductor device, in accordance with the present invention.

BEST MODE FOR CARRYING OUT THE INVENTION

FIG. 1 is a front elevation sectional view of a single composite capacitor structure 100 having semiconducting material 15, such as polysilicon (poly-Si), formed on an insulating layer 14, such as silicon oxide (SiO) and silicon dioxide ($SiO_2$), and comprising a plurality of capacitor elements 16, 17, 18 which are designed with identical predetermined or "drawn" widths 19, 20, 21 formed between successive STI structures 2, 3, 11, for example only. A device may comprise at least one composite capacitor structure 100', 100" respectively comprising a plurality of capacitor elements 16', 17', 18' and 16", 17", 18", which are designed with identical predetermined or "drawn" widths 19', 20', 21', or 19", 20", 21", formed between successive STI structures 2', 3', 11' and 2", 3", 11", wherein 19=20=21, 19'=20'=21', 19"=20"=21", and wherein 19≠19'≠19", 20≠20'≠20", 21≠21'≠21" (not shown). For each respective composite capacitor structure 100, 100', 100", the actual active region width is determined by using a Gate current measurement technique and a subsequent calibration procedure. FIG. 1 shows a semiconducting layer 15 from which a "gate electrode" 9 (as shown in FIG. 2) of the capacitor elements 16, 17, 18 will be formed.

FIG. 2 is a front elevation sectional view of the typical capacitor elements 16, 17, 18 of the composite capacitor structure 100 shown in FIG. 1. As shown in FIG. 2, the capacitor elements 16, 17, 18, formed between successive STI structures 2, 3, comprise an upper area of a substrate 1 (i.e., an active region 4), a tunnel oxide layer 7, and a gate electrode 9, wherein the gate electrode 9 has been formed from the semiconducting layer 15, and wherein the tunnel oxide layer 7 has been formed from the insulating layer 14 (as shown in FIG. 1). The gate current value of each at least one composite capacitor structure 100 is a cumulative function of respective capacitor elements 16, 17, 18 (i.e., of each respective gate electrode 9, each respective tunnel oxide layer 7, and each respective active region 4). The gate electrode 9 of the respective capacitor elements 16, 17, 18 is electrically equivalent to a poly-Si floating gate, as used in a MOS transistor device. The substrate 1 comprises at least one semiconducting material selected from a group consisting essentially of silicon, germanium, and a binary material such as gallium arsenide. The tunnel oxide layer 7 comprises an insulating material, such as silicon oxide or silicon dioxide.

Still referring to FIG. 2, a plurality of STI structures 2, 3 are formed and disposed in the substrate 1 to separate and insulate the respective capacitor elements 16, 17, 18 from one another. The active region 4 between the STI structures 2, 3 will ultimately be fabricated into the MOS transistor having the active region 4 with an active region width 10, a source, a drain, and a gate channel. The tunnel oxide layer 7 comprises thinning opposing end portions respectively disposed in a first zone 5 and a second zone 6. The first zone 5 of the tunnel oxide layer 7 is disposed adjacent to the STI structure 2 of the active region 4; and the second zone 6 of the tunnel oxide layer 7 is disposed adjacent to the STI structure 3. During the gate current measurement, a voltage is placed across each at least one composite capacitor structure 100, 100' 100" to measure its respective gate current value.

Referring now to FIG. 3, a plot is shown of the various gate current values $I_{g,100}$, $I_{g,100'}$, $I_{g,100"}$ for the respective composite capacitor structures 100, 100', 100", of FIG. 1, as a function of the respective predetermined widths $W_i$ (e.g., $W_i$: $W_{100}$=19=20=21, $W_{100'}$=19'=20'=21', $W_{100"}$=19"=20"=21". These gate current values $I_{g,100}$, $I_{g,100'}$, $I_{g,100"}$ facilitate developing a $I_W$ curve for use in determining the active region width 10 of an ultimately fabricated MOS transistor of a flash memory semiconductor device. Initially, in a fabrication process, all that is known about each capacitor element 16, 17, 18 is that it has a predetermined width $W_i$ which may be respectively indicated as 19, 20, 21. In the illustrated example, three composite capacitor structures 100, 100', 100" are formed according to the geometry shown in FIG. 1; and gate current $I_g$ is measured at an applied gate voltage $V_g$=−10 V, which is a relatively low gate voltage. The low applied gate voltage reduces any possible parasitic resistance that might affect the accuracy of the voltage drop across the tunnel oxide layer. The gate current $I_g$ is next measured, using a gate current measurement technique, for each composite capacitor structure 100, 100', 100" and is respectively recorded as $I_{g,100}$, $I_{g,100'}$, $I_{g,100"}$. The gate current $I_g$ for each composite capacitor structure 100, 100', 100" may then be represented on the y-axis (ordinate) of the graph (e.g., in picofarads); and each respective predetermined width $W_i$ may be represented on the x-axis (abscissa) of the graph (e.g., in microns). The points along the curve $I_W$, so determined in the present invention, substantially form a "line" which then may be designated as IW (i.e., a quasi-linear representation).

In the present invention, particularly in the calibration procedure, this "line" is extrapolated to intersect the x-axis at zero capacitance, wherein such point on the abscissa indicates the theoretical difference $W_{Ig=0}$ (i.e., a calibration term) between each respective predetermined width $W_i$ and the active region width 10 of the active region 4 between zones 5 and 6 of the tunnel oxide layer 7 and between the successive STI structures 2, 3, 11. Noteworthy, is that, due to nonlinearities, direct measurement of $W_{Ig=0}$ is not empirically possible at zero gate current; however, the present method, using a linear approximation and extrapolation (calibration procedure) in conjunction with using a gate current measurement technique, provides a superior means for better determining each respective active region width 10. Once $W_{Ig=0}$ is known (extrapolated) for a particular semiconductor fabrication process, as plotted in FIG. 3, the active region width 10 is determined by subtracting $W_{Ig=0}$ from the various predetermined widths $W_i$ (e.g., 19, 20, 21) (i.e., active region width 10=$W_i$-$W_{Ig=0}$), thereby improving the programming current, the programmed voltage threshold, the threshold voltage distribution, access time, and chip speed in a flash memory semiconductor device.

Industrial Applicability

The present invention applies to the semiconductor fabrication industry. In particular, the present invention relates to the flash memory device fabrication industry. With still greater particularity, the present invention applies to testing procedures, used in the semiconductor device fabrication industry, for determining the active region width disposed between shallow trench isolation structures which insulate circuit elements in flash memory arrays.

Scope of the Invention

Information as herein shown and described in detail is fully capable of providing the solutions of the present invention; and the presently preferred embodiment is, thus, representative of the subject matter which is broadly contemplated by the present invention. The scope of the present invention fully encompasses other embodiments, which may become obvious to those skilled in the art, and is to be limited accordingly by nothing other than the appended claims, wherein reference to an element in the singular is not intended to mean "one and only one," unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public, regardless of whether the element, component, or method step is explicitly recited in the claims. However, it should be readily apparent to those of ordinary skill in the art that various changes and modifications in form, semiconductor material, and fabrication material detail may be made without departing from the spirit and scope of the inventions as set forth in the appended claims. No claim herein is to be construed under the provisions of 35 U.S.C. §112, sixth paragraph, unless the element is expressly recited using the phrase "means for."

What is claimed:

1. A method for determining an active region width, said method comprising steps of:
    forming a plurality of composite capacitor structures, each of said plurality of composite capacitor structures comprising:
        a substrate having at least two shallow trench isolation structures formed therein and at least one active region situated between said at least two shallow trench isolation structures, said at least one active region having a predetermined width and said active region width;
        an insulating layer formed on said substrate;
        a semiconductor layer formed on said insulating layer;
    determining an extrapolated width by utilizing respective gate currents of said each of said plurality of composite capacitor structures;
    wherein said active region width is determined by a difference between said predetermined width and said extrapolated width.

2. The method of claim 1 wherein said step of determining said extrapolated width further comprises:
    plotting said respective gate currents as a function of said predetermined width in said each of said plurality of composite capacitor structures, said respective gate currents being plotted on a first axis and said predetermined width being plotted on a second axis, said function substantially forming a line;
    extrapolating said line to form an intersection of said line and said first axis, said intersection determining said extrapolated width.

3. The method of claim 1 wherein said step of forming said plurality of composite capacitor structures further comprises:
    forming each of said at least two shallow trench isolation structures having opposing upper corner regions;
    forming said insulating layer comprising a tunnel oxide layer being disposed between said opposing upper corner regions, said tunnel oxide layer having a mid-portion and opposing end portions; and
    respectively disposing said opposing end portions adjacent said opposing upper corner regions.

4. The method of claim 1 wherein said predetermined width in said each of said plurality of composite capacitor structures is distinct.

5. The method of claim 3 wherein said step of forming said plurality of composite capacitor structures further comprises thinning said opposing end portions.

6. The method of claim 3 wherein said step of forming said plurality of composite capacitor structures further comprises forming said opposing end portions such that said opposing end portions are substantially thinner than said mid-portion.

7. The method of claim 1 wherein said substrate comprises at least one semiconducting material selected from the group consisting of silicon, germanium, and gallium arsenide.

8. The method of claim 1 wherein said semiconductor layer comprises polysilicon.

9. The method of claim 1 further comprising a step of determining said respective gate currents of said each of said plurality of composite capacitor structures prior to said step of determining said extrapolated width.

10. The method of claim 1 wherein said active region width is utilized for fabricating a flash memory semiconductor device.

11. A method for determining an active region width, said method comprising steps of:
- forming a plurality of composite capacitor structures, each of said plurality of composite capacitor structures comprising:
  - a substrate having at least two shallow trench isolation structures formed therein and at least one active region situated between said at least two shallow trench isolation structures, said at least one active region having a predetermined width and said active region width;
  - an insulating layer formed on said substrate;
  - a semiconductor layer formed on said insulating layer;
  - wherein said predetermined width in said each of said plurality of composite capacitor structures is distinct;
- determining an extrapolated width by utilizing respective gate currents of said each of said plurality of composite capacitor structures and said predetermined width in said each of said plurality of composite capacitor structures;
- wherein said active region width is determined by a difference between said predetermined width and said extrapolated width.

12. The method of claim 11 wherein said step of determining said extrapolated width further comprises:
- plotting said respective gate currents as a function of said predetermined width in said each of said plurality of composite capacitor structures, said respective gate currents being plotted on a first axis and said predetermined width being plotted on a second axis, said function substantially forming a line;
- extrapolating said line to form an intersection of said line and said first axis, said intersection determining said extrapolated width.

13. The method of claim 11 wherein said step of forming said plurality of composite capacitor structures further comprises:
- forming each of said at least two shallow trench isolation structures having opposing upper corner regions;
- forming said insulating layer comprising a tunnel oxide layer being disposed between said opposing upper corner regions, said tunnel oxide layer having a mid-portion and opposing end portions; and
- respectively disposing said opposing end portions adjacent said opposing upper corner regions.

14. The method of claim 11 further comprising a step of determining said respective gate currents of said each of said plurality of composite capacitor structures prior to said step of determining said extrapolated width.

15. The method of claim 13 wherein said step of forming said plurality of composite capacitor structures further comprises thinning said opposing end portions.

16. The method of claim 13 wherein said step of forming said plurality of composite capacitor structures further comprises forming said opposing end portions such that said opposing end portions are substantially thinner than said mid-portion.

17. The method of claim 11 wherein said substrate comprises at least one semiconducting material selected from the group consisting of silicon, germanium, and gallium arsenide.

18. The method of claim 11 wherein said step of forming said plurality of composite capacitor structures further comprises forming at least one capacitor element between said at least two shallow trench isolation structures at said at least one active region.

19. The method of claim 11 wherein said semiconductor layer comprises polysilicon.

20. The method of claim 11 wherein said active region width is utilized for fabricating a flash memory semiconductor device.

* * * * *